US005812441A

United States Patent [19]
Manning

[11] Patent Number: 5,812,441
[45] Date of Patent: Sep. 22, 1998

[54] MOS DIODE FOR USE IN A NON-VOLATILE MEMORY CELL

[75] Inventor: Monte Manning, Kuna, Id.

[73] Assignee: Micron Technology, Inc., Boise, Id.

[21] Appl. No.: 731,804

[22] Filed: Oct. 21, 1996

[51] Int. Cl.[6] .................................................. G11C 17/00
[52] U.S. Cl. ........................................... 365/100; 365/96
[58] Field of Search .............................. 365/100, 96, 159, 365/189.11

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 3,801,966 | 4/1974 | Terao | 365/159 |
| 4,099,260 | 7/1978 | Lynes et al. | 365/105 |
| 4,115,872 | 9/1978 | Bluhm | 365/163 |

(List continued on next page.)

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |

OTHER PUBLICATIONS

Betty Prince, "Semiconductor Memories", pp. 118–123, 1983.

Kim and Kim, "Effects of High–Current Pulses on Polycrystalline Silicon Diode with n–type Region Heavily Doped with Both Boron and Phosphorus," *J. Appl Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors,"*IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schouttky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—Th Way to Two Micron Pitch Multilevel Metallisation," *IEEE*, 23–29, 1984.

*Primary Examiner*—David C. Nelms
*Assistant Examiner*—Michael T. Tran
*Attorney, Agent, or Firm*—Fletcher, Yoder & Edwards

[57] ABSTRACT

A variable resistance material-based memory cell is disclosed for use in an electronic memory. The memory cell includes a MOS diode for delivering large amounts of current to the variable resistance material, as needed during programming of the memory cell. In one embodiment, a buried contact under the gate is used as the drain of the device. The buried contact allows formation of a very short channel, causing a "snapback" phenomenon in the MOS diode and thereby greatly increasing the amount of current flow across the device. This buried contact construction has the additional advantage of reducing the area needed for the memory cell. Additionally, the processing is simple and may be performed using the same techniques normally used during the fabrication of electronic memories.

4 Claims, 4 Drawing Sheets

U.S. PATENT DOCUMENTS

| | | | |
|---|---|---|---|
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 427/87 |
| 4,442,507 | 4/1984 | Roesner | 365/100 |
| 4,458,260 | 7/1984 | McIntyre et al. | 357/30 |
| 4,502,208 | 3/1985 | McPherson | 29/584 |
| 4,569,698 | 2/1986 | Feist | 148/1.5 |
| 4,677,742 | 7/1987 | Johnson | 29/591 |
| 4,757,359 | 7/1988 | Chiao et al. | 357/23.5 |
| 4,795,657 | 1/1989 | Formigoni et al. | 365/100 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,257,222 | 10/1993 | Lee | 365/96 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,363,329 | 11/1994 | Troyan | 365/184 |
| 5,510,629 | 4/1996 | Karpovich et al. | 257/50 |
| 5,513,142 | 4/1996 | Arimoto et al. | 365/189.11 |
| 5,534,711 | 7/1996 | Ovshinsky et al. | 257/3 |

MOS DIODE FOR USE IN A NON-VOLATILE MEMORY CELL

The present invention relates generally to the use in a variable resistance memory materials in semiconductor devices. More particularly, the invention relates to the formation of a MOS diode element that may be used in conjunction with such a memory material to form a memory cell for use in an a non-volatile electronic memory.

The use of programmable, variable resistance materials, such as chalcogenide, amorphous silicon, or antifuse, in electronic memories is known in the art. The use of chalcogenide, for example, is described in U.S. Pat. Nos. 5,296,205, 5,335,219, 5,341,328, and 5,359,205, all to Ovshinsky et al, all of which are incorporated herein by reference. These patents are believed to evidence the state of the prior art and to represent current theory of operation and function of chalcogenide materials and chalcogenide-based memories known to those skilled in the art.

Briefly, variable resistance materials are materials that can be caused to change physical state, and therefore resistivity level, in response to an electrical input stimulus. By way of example, chalcogenides are materials that may be electrically stimulated to change states and resistivities, from an amorphous state to a crystalline state, for example, or to exhibit different resistivities while in a crystalline state. A chalcogenide material may be predictably placed in a particular resistivity state by running a current of a certain amperage through it. The resistivity state so fixed will remain unchanged unless and until a current having a different amperage within the programming range is run through the chalcogenide material.

Because of these unique characteristics, chalcogenide materials may be used as memory elements for storing data in binary or higher-based digital systems in memory cells. Such memory cells will normally include a memory element that is capable of assuming multiple, generally stable, states in response to the application of a stimulus. In most cases, the stimulus will be a voltage differential applied across the element so as to cause a predetermined current to flow through the memory element. A chalcogenide-based memory cell will typically include a chalcogenide memory element for storing data and an access element, coupled to the memory element, for use in programming and sensing the stored data. The access element may be, in one embodiment, a diode. A chalcogenide-based memory cell will typically be accessible to external circuitry by the selective application of voltages to a wordline and a digitline, as are conventionally used in semiconductor memories.

Because of the unique operating characteristics of variable resistance memory elements, current control is crucial to facilitate programming. Programming of chalcogenide, for example, requires very high current densities. In this regard, it is desirable that a chalcogenide-based memory cell include a diode capable of forcing a large current flow in the forward direction, while allowing little or no current flow in the reverse direction. It has been suggested that this result can be accomplished using a simple N+/P− diode that relies on the silicon substrate to provide the necessary current. However, this solution has the disadvantage that substrate resistance is quite high, limiting the amount of current that can be delivered. This problem might be avoided by periodic tapping of the substrate to reduce resistance between the periphery circuitry and the memory cell, but such tapping would have to occur frequently, and the circuitry required would greatly increase the size of the array.

Accordingly, there is a need for a small, easily manufactured diode that can meet the performance requirements of variable resistance memory cells. Various diode structures have been devised to meet this need. For example, "A Poly-Silicon Pillar Diode For Use In A Non-Volatile Memory Cell" and "A Stack/Trench Diode For Use With A Multi-State Material In A Non-Volatile Memory Cell" have been disclosed in U.S. patent application Ser. Nos. 08/474,028 (filed Jun. 7, 1995) and 08/483,763 (filed Jun. 7, 1995), respectively, both of which are assigned to Micron Technology, Inc. Yet another diode is described herein.

SUMMARY OF THE INVENTION

The present invention provides a chalcogenide-based memory cell including a MOS diode for use in delivering large amounts of current to the chalcogenide material. The MOS diode may comprise a simple MOS transistor with its gate and drain shorted together. In a preferred operating mode, the voltage on the gate/drain is brought to a very high level relative to the source, causing a "snapback" phenomenon in the MOS device. When this happens, impact ionization at the drain injects holes into the substrate, locally raising the substrate bias. This substrate bias has the effect of activating a parasitic bipolar device comprising the source, substrate and drain of the MOS device. This provides a very large amount of current, far surpassing that deliverable by a normal MOS diode operating in the linear or saturation regions.

In a preferred embodiment of the MOS diode, the gate of the device also serves as a buried contact for the drain of the device. The use of the buried contact configuration makes it possible to have a very short transistor channel, allowing snapback to occur at a drain/gate voltage significantly lower than otherwise possible. In this way, the current drive of the device is greatly increased. This approach has the additional advantage of reducing the area required for the MOS device. In addition, processing is simple and may be performed using the same techniques normally used for fabrication of periphery circuitry.

BRIEF DESCRIPTION OF THE DRAWINGS

The feature and advantages of the present invention will be best appreciated with reference to the following detailed description and the accompanying drawings, in which.

DETAILED DESCRIPTION AND SPECIFICATION

The features of the present invention may be fully understood with reference to the following detailed description. In all cases, it should be understood that this discussion is made with reference to exemplary embodiments. These embodiments are not intended to limit the scope of the invention as defined by the claims. Variations and modifications of the specific embodiments described herein will be apparent to those skilled in the art.

Figure 1:
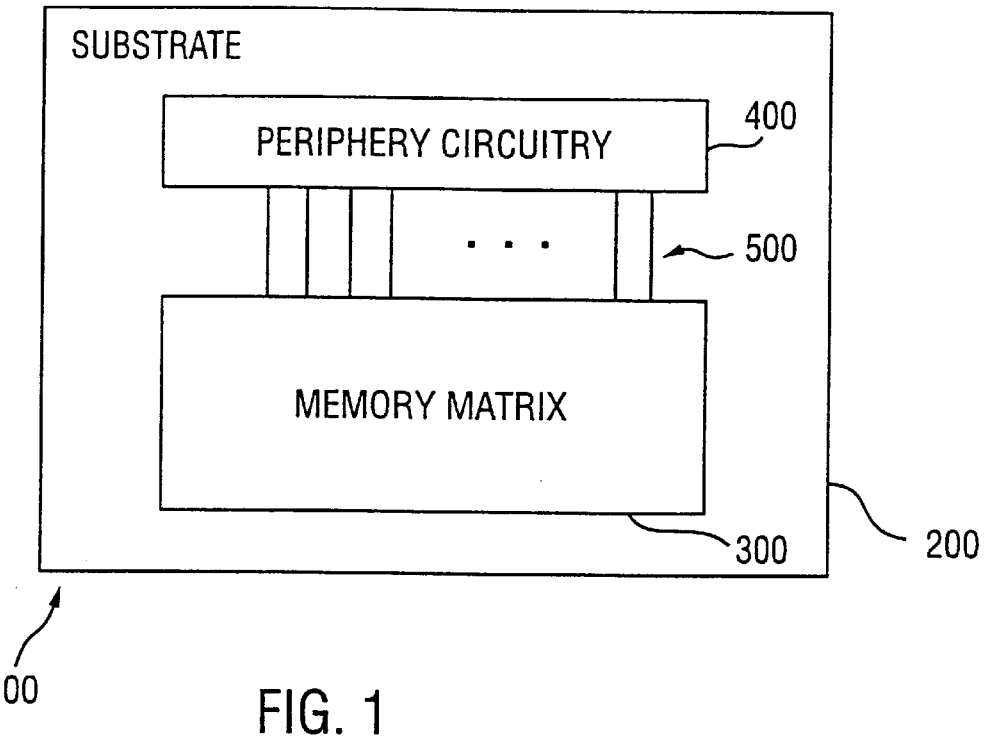
FIG. 1 is a schematic representation of a semiconductor substrate having a memory matrix a formed thereon in electrical communication with periphery circuitry.

FIG. 1 is a schematic depiction of electrical memory 100 such as the present invention can be used in connection with. Electrical memory 100 comprises substrate 200 with memory matrix 300 and periphery circuitry 400 formed thereon. Memory matrix 300 comprises a plurality of memory cells for storing data, as described below. Periphery circuitry 400 comprises circuitry for addressing the memory elements located in memory matrix 300 and storing data therein or retrieving data therefrom. In this regard, periphery circuitry 400 may include circuitry for regulating the voltage level applied across each memory cell in order to determine which of the multiple possible resistivity levels will be programmed into that cell. Memory matrix 300 and addressing matrix 400 are in electrical communication via electrical connection 500.

Figure 2:
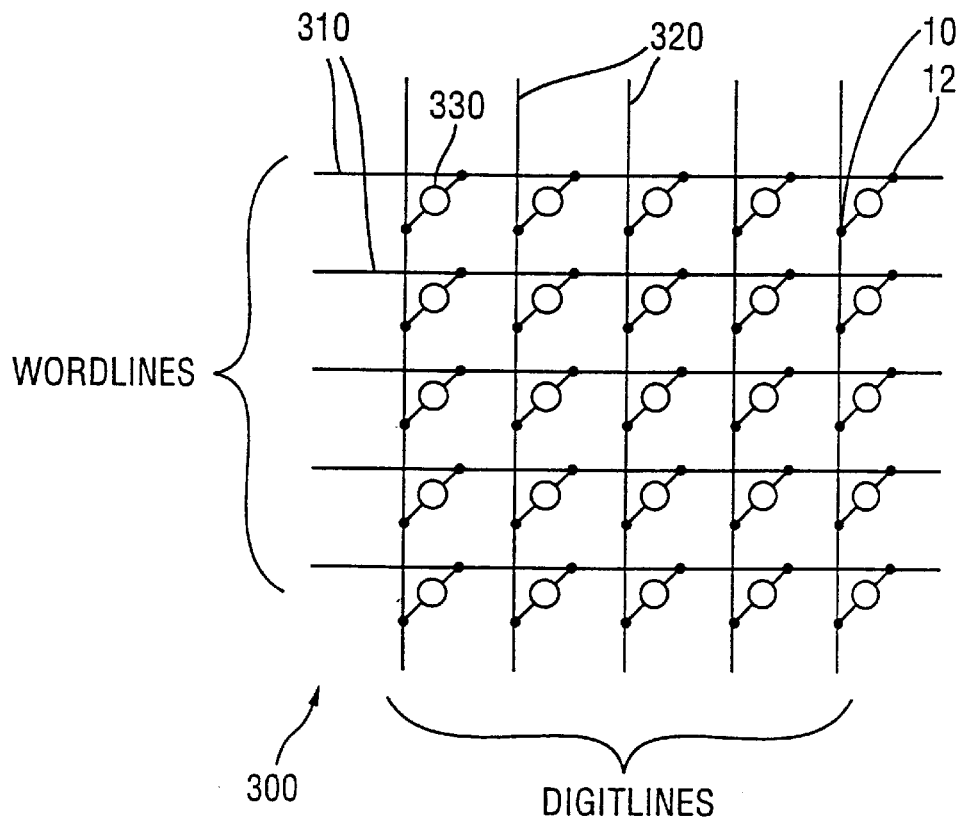
FIG. 2 is a representation of a memory matrix formed by a plurality of memory cells disposed at the intersections of wordlines and digitlines in accordance with the present invention.

FIG. 2 is a conceptual depiction of memory matrix 300. Memory matrix 300 comprises a plurality of intersecting wordlines 310 and digitlines 320. One memory cell 330 is disposed at each intersection for storing data. Each memory cell 330 has a wordline node 12 and a digitline node 10 connected as shown. Wordlines 310 and digitlines 320 are electrically coupled to addressing matrix 400, in a manner well known in the art, so that each memory cell 330 can be uniquely addressed and accessed as needed. In the embodiment discussed herein, the normal state of wordline 310 is a low voltage and the normal state of digitline 320 is a high voltage. When a particular memory cell 330 is being written, the voltages on the wordline 310 and digitline 320 corresponding to that cell 330 are reversed from their normal state. These conventions can be altered without departing from the principles and features of the present invention.

Figure 3:
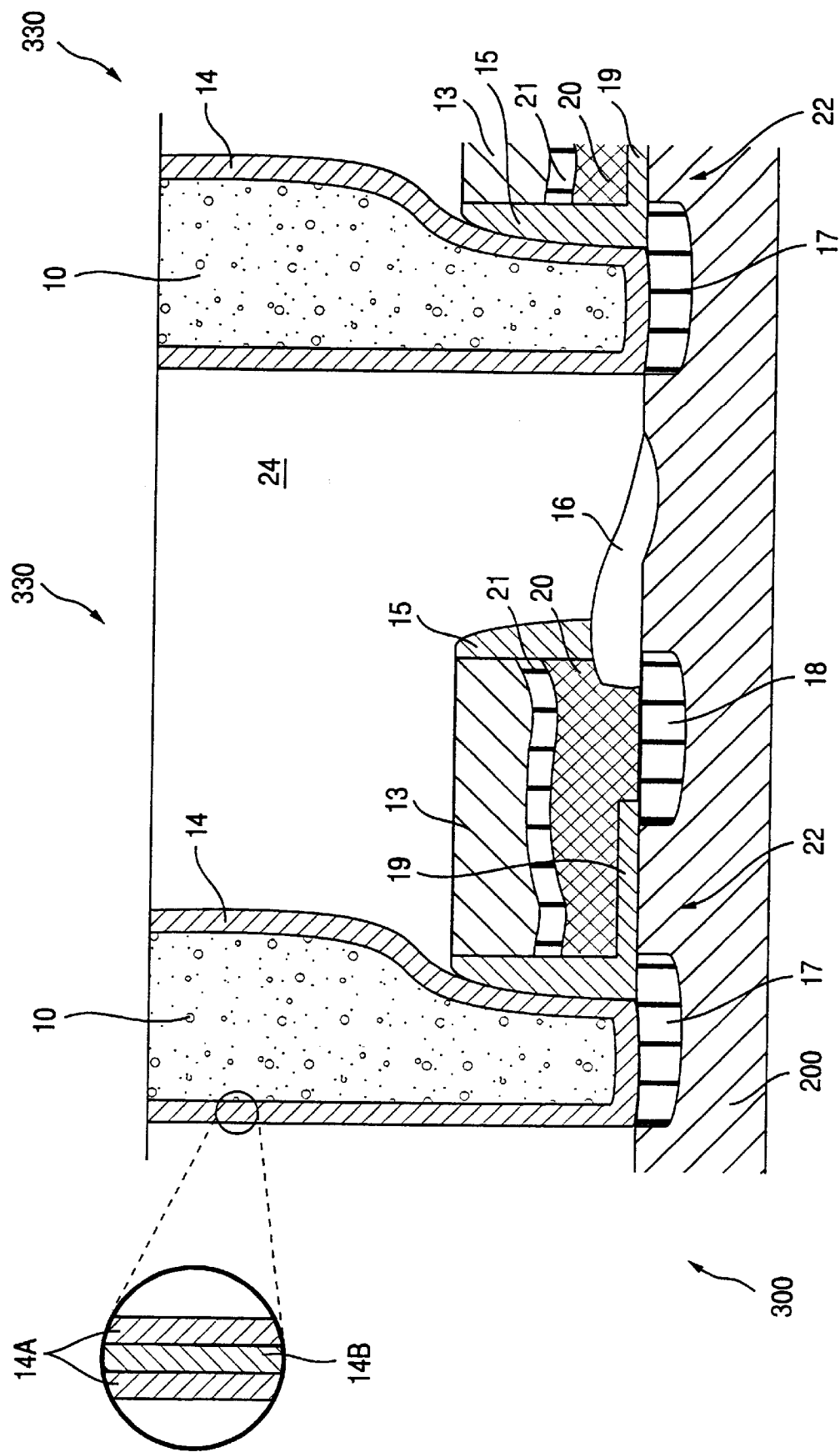
FIG. 3 is a cross-sectional view of a variable resistance material-based memory cell according to the present invention.
Figure 3A:
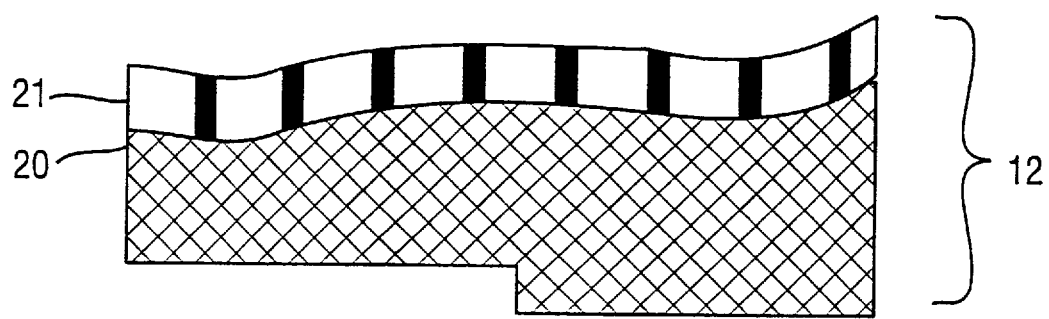
FIG. 3A is a blow up of the gate conductor portion of the variable resistance material-based memory cell of FIG. 3.

FIG. 3 shows a cross-section of memory matrix 300 including portions of two memory cells 330 according to the present invention. FIG. 3A shows a blow up of one portion of a memory cell 330. Memory matrix 300 is formed integrally in substrate 200, which is preferably a p-type substrate.

Memory cell 330 is shown including digitline node 10 and wordline node 12 which is an electrical contact that can comprise, as indicated in FIG. 3A, a polysilicon gate 20 and silicide gate conductor 21. Digitline node 10 is an electrode, preferably formed of metal or doped polysilicon in a manner well known in the art, disposed in a contact hole extending downwardly through interlayer dielectric 24. Each digitline node 10 of all memory cells 330 in the plane of the cross-section shown are tied to a single digitline 320, as depicted in FIG. 2. Likewise, each wordline node 12 of all memory cells 330 in a plane perpendicular to the plane of the cross-section shown are tied to a single wordline 310, as depicted in FIG. 2. Memory cell 330 can also include insulative layer 13. Insulative layer 13 can be comprised of an oxide or nitride or any other insulator known in the art.

Disposed about digitline node 10 is memory element 14. Memory element 14 preferably comprises chalcogenide layer 14b and a pair of electrodes 14a sandwiching chalcogenide layer 14b. The electrodes 14a provide electrical contact for the chalcogenide layer 14b. Electrodes 14a may comprise a metal layer and a carbon layer, where the carbon layer acts as a buffer between the metal layer and the chalcogenide material to prevent contamination. Alternatively, electrodes 14a and 14b may not be separate layers at all, but may be considered to be the two sides of the layer of the variable resistance material (e.g., the chalcogenide layer 14b). The composition and fabrication of chalcogenide layer 14b is known in the prior art, as described in the Ovshinsky patents referenced in the Background section. The layer 14b may be about 500 angstroms thick, but other thicknesses may be selected. Memory element 14 retains a particular resistivity level depending on the amount of current run through it because the physical state of the chalcogenide is changed by certain current levels. For example, a binary device constructed according to the embodiment set out herein might have a high resistivity level of approximately 100 kohms and a low resistivity level of approximately 1 kohm, depending on whether a high current density or a low current density is created when the device is written to.

Many chalcogenide alloys may be suitable for use as a memory element in connection with the present invention. Preferably, the chalcogenide composition will be formed from tellurium, selenium, germanium, antimony, bismuth, lead, strontium, arsenic, sulfur, silicon, phosphorous, oxygen, and mixtures or alloys of these elements. These alloys will be selected so as to create a material capable of assuming multiple, generally stable, states in response to the stimulus applied. Alloys of tellurium and germanium may be desirable, and materials having approximately 80–85% tellurium and approximately 15% germanium, in combination with other elements such as sulfur or arsenic, may be particularly desirable. An exemplary chalcogenide alloy suitable for use in the present invention is 56% Te, 22% Ge, 22% Sb.

An isolating layer 16 is shown disposed between adjacent memory cells 330. Isolating layer 16 may be a field oxide layer, e.g., $SiO_2$, as is known in the art. Isolating layer 16 may be formed by a trench isolation technique or any other known isolation technique. The purpose of isolating layer 16 is to isolate adjacent memory cells 330 from one another. Also, an interlayer dielectric 24 is formed above substrate 200 in the region surrounding each cell 330, in part to provide electrical isolation among neighboring cells 330. Interlayer dielectric 24 will preferably be a layer of borophosphosilicate glass (BPSG) or phosphosilicate glass (PSG), but other insulators may be used.

The remainder of memory cell 330 comprises the MOS diode referred to above. Disposed in P-type substrate 200 are two N+ regions that form the source 17 and drain 18 of the MOS diode with a channel 22 defined therebetween. Source 17 is positioned in electrical communication with memory element 14 so as to form an electrical connection between digitline node 10 and source 17 through memory element 14. A gate oxide 19 is disposed above substrate 200 in the region above channel 22. Gate 20 is formed directly above drain 18 so as to short these elements together, thereby creating the operative connection of the MOS diode. In this way, gate 20 also serves as a buried contact for drain 18, as described below. Gate 20 is preferably a layer of polysilicon. Polysilicon gate 20 will preferably be doped with arsenic (if a p-type substrate 200 is used). The arsenic will then be available for out-diffusion into the adjoining drain contact region. Because the resistance of the gate is critical to device performance, it is preferable to use a gate conductor 21, formed of a low resistance material such as tungsten silicide ($WSi_2$) or titanium silicide ($TiSi_2$), above polysilicon gate 20. Spacers 15 are disposed about the MOS diode to provide insulation from neighboring regions and to provide implant boundaries for tailoring transistor characteristics. Spacers 15 are preferably formed of nitride, in part to facilitate a subsequent self-aligned contact etch or memory element 14.

FIG. 3 shows memory cell 330 in its preferred embodiment in which gate 20 acts as a buried contact for drain 18. Since drain 18 and gate 20 are in direct contact, and preferably shorted together, to create the MOS diode, gate 20 can serve a double role as a buried contact for drain 18. This buried contact construction has several advantages that will be appreciated. First, since no surface contact is required for drain 18, the overall space requirements of memory cell 330 are reduced. This space savings is particularly important for chalcogenide-based memories, since the diode size is a critical limitation on how small the entire memory cell can be made. A further advantage of the buried contact construction is that it allows the formation of a short channel 22, since channel length is not limited by the available resolution of photolithography techniques that are typically used to define the channel length. Thus, a channel length of 0.2 microns or less is possible (FIG. 3 is not drawn to scale on this point). As described below, a short channel encourages snapback phenomenon to occur in the MOS diode, thereby increasing the current flow deliverable by the device. Finally, the buried contact configuration does not greatly increase fabrication process complexity. There is only one additional masking step needed to define the buried contact area region through the gate oxide. The doped drain region can be created by out-diffusion of dopants from the gate in a manner known in the art, followed by deposition of the gate conductor 21, and subsequent conventional processing.

Figure 4:
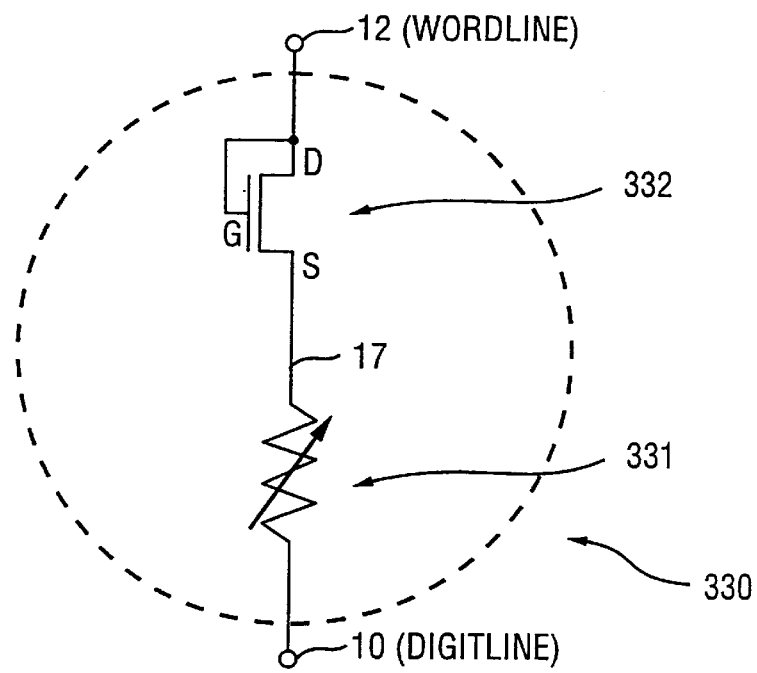
FIG. 4 is a schematic representation of a variable resistance material-based memory cell according to the present invention.

FIG. 4 is a circuit schematic of memory cell 330 that will be useful in understanding the operation and features of the present invention. Memory cell 330 is depicted schematically as comprising a memory element 331 and a MOS diode 332. It will be recognized that the digitline and wordline nodes 10 and 12 shown in FIG. 4 correspond directly to the identically-numbered nodes in FIGS. 2 and 3. It will further be recognized that memory element 331 corresponds to memory element 14 shown in FIG. 3, and that the transistor source (S), gate (G) and drain (D) shown in FIG. 4 correspond to the similar portions of FIG. 3 labeled as elements 17, 20, and 18 respectively. As in FIG. 3, the gate and drain of the transistor are shorted together, thereby forming a MOS diode.

As is clear from FIG. 4, when wordline node 12 is biased above digitline node 10, MOS diode 332 turns "on," causing current to flow through memory element 331. When wordline node 12 is biased below digitline node 10, MOS diode 332 is switched "off" and essentially no current flows through memory element 331. Thus, with reference to FIG. 2, a memory cell 330 can be written to by taking that cell's wordline 310 HIGH and its digitline 320 LOW. The amount of current produced is a product of the voltage difference between nodes 12 and 10. This can be an important issue since chalcogenide-based memory cells are capable of being used not only as binary storage devices, but also as multi-level storage devices. Where the amount of current flow is an important control parameter for operation of memory cell 330, the current flow through memory cell 330 will preferably be controlled by periphery circuitry 400.

With reference again to FIG. 3, the expected operation of memory cell 330 can be seen to correspond to the circuit schematic of FIG. 4. When wordline node 12 is biased at a higher voltage than digitline node 10, gate 20 and drain 18 are at a higher voltage than source 17. This causes MOS diode 332 to switch ON, causing current to flow from drain 18 to source 17 across channel 22. Ultimately, the result of biasing wordline node 12 at a voltage above digitline node 10 is to cause a large current to flow across memory element 14, thus programming a certain level of resistivity therein. Here again, the conventions used to describe this preferred embodiment are merely exemplary and can be reversed or altered without departing from the invention. In particular, the biasing polarity on the wordline and digitline, the substrate and contact doping types, and the labels source and drain are not intended to be limiting.

Figure 5:
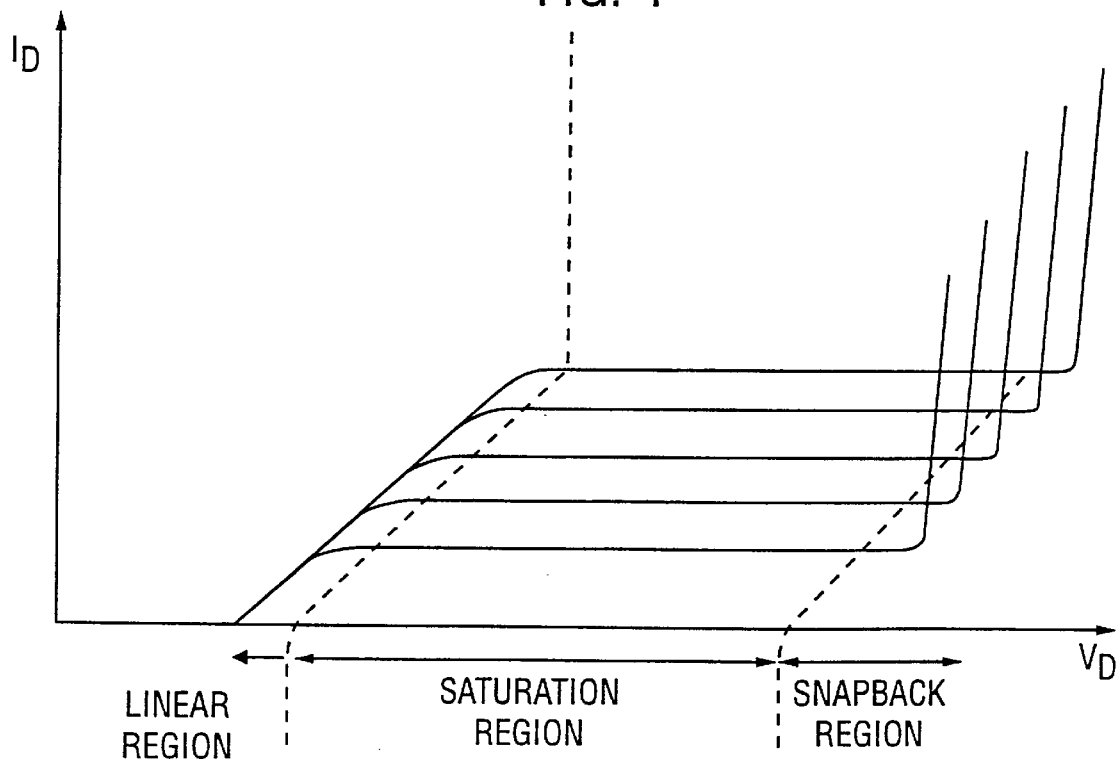
FIG. 5 is a plot of a drain current as a function of drain voltage for MOS transistor devices.

The special advantages of the embodiment shown in FIG. 3 in effecting the desired operation of memory cell 330 can now be understood. As is discussed above, it is critical to the operation of memory cell 330 that a large current flow be deliverable to memory element 331. Memory cell 330 of the present invention is particularly effective in this regard, in part, because it is designed to cause snapback in MOS diode 332. As is known, snapback is a phenomenon experienced with MOS transistors operating at high bias voltages at the drain relative to the source. FIG. 5 is a current plot showing current through the drain of a MOS transistor ($I_D$) as a function of voltage at the drain ($V_D$) and various choices of gate bias. The normal operating range of a MOS transistor is the saturation region, where $I_D$ is relatively constant over a range of $V_D$. Beyond this region, however, at very large drain voltages, current flow is dramatically increased. This phenomenon is known as snapback. This phenomenon is believed to be the result of impact ionization of the majority carriers (e.g., electrons in an NMOS device) into the crystal lattice sites of the substrate at the drain (due to high drain voltage). Impact ionization causes the generation of electron-hole pairs. The holes are swept into the surrounding substrate, locally raising the substrate bias. If severe enough, this bias can have the effect of switching ON the parasitic npn bipolar transistor comprising the source (emitter), substrate (base) and drain (collector) of the MOS device by forward-biasing the source to substrate junction. This bipolar device greatly increases current flow through the channel 22.

The memory cell 330 of the preferred embodiment shown in FIG. 3 includes several features designed to encourage snapback. The use of a buried contact for the drain 18 of the device allows formation of a short channel 22 since the channel length is not constrained by the resolution of the photolithography process used. A short channel 22 encourages snapback to occur at lower drain voltages. Another preferred feature of the present invention is a sharp drain junction, which further increases snapback by intensifying the electric field at the drain. The abrupt junction is preferably formed by doping polysilicon gate 20 with arsenic, and then forming drain 18 by out-diffusion of dopants from the gate 20.

While the invention is susceptible to various modifications and alternative forms and while specific embodiments have been shown by way of example in drawings and have been described in detail herein, it should be understood that the invention is not intended to be limited to the particular forms disclosed. Rather, the invention is to cover all modifications, equivalents and alternatives falling within the spirit and scope of the invention as defined by the appended claims.

I claim:

1. A variable resistance material-based memory cell comprising:

a first node and a second node;

a memory element having a first electrode and a second electrode, and having a resettable variable resistance material layer disposed between the first and second electrodes, said first electrode being electrically coupled to said first node; and a MOS diode having a gate, a source, a drain, and a channel defined between said source and said drain, said channel being about 0.2 microns long or less, said source being electrically coupled to said second electrode of said memory element, and said gate and said drain being electrically coupled to said second node, said diode being configured to promote operation in a snapback region during application of a programming current to said memory cell.

2. A variable resistance material-based memory matrix for storing data comprising:

a plurality of first address lines and a plurality of second address lines; and a plurality of memory cells, each said memory cell being electrically coupled between one of said first address lines and one of said second address lines, each said memory cell comprising a resettable variable resistance material memory element connected in series with a MOS diode, said MOS diode comprising a gate, a source, a drain, and a channel defined between said source and said drain, said MOS diode being configured to promote operation in a snapback region during application of voltage to said memory cell during operation, wherein said channel region of each said MOS diode is about 0.2 microns or less.

3. A memory cell comprising:

a reprogrammable memory element; and a diode-connected transistor coupled to said memory element, said transistor having a channel length of no more than 0.2 microns.

4. A memory cell comprising:

a reprogrammable memory element; and a diode-connected transistor coupled to said memory element, said transistor operating in a snapback region during reprogramming of said memory element, and said transistor having a channel length less than 0.2 microns.

* * * * *